US007292954B2

(12) United States Patent
Deller et al.

(10) Patent No.: US 7,292,954 B2
(45) Date of Patent: Nov. 6, 2007

(54) ACCEPTANCE TESTING OF ACTUATORS USING BACKLASH AND STICTION MEASUREMENTS

(75) Inventors: Robert W. Deller, Valencia, CA (US); Joon H. Lee, Santa Clarita, CA (US)

(73) Assignee: HR Textron Inc., Santa Clarita, CA (US)

( * ) Notice: Subject to any disclaimer, the term of this patent is extended or adjusted under 35 U.S.C. 154(b) by 84 days.

(21) Appl. No.: 11/190,667

(22) Filed: Jul. 27, 2005

(65) Prior Publication Data
US 2006/0060078 A1    Mar. 23, 2006

Related U.S. Application Data

(60) Provisional application No. 60/591,836, filed on Jul. 28, 2004.

(51) Int. Cl.
*G01L 25/00* (2006.01)
(52) U.S. Cl. .................................... 702/115
(58) Field of Classification Search ............... 702/115
See application file for complete search history.

(56) References Cited

U.S. PATENT DOCUMENTS

| | | | | |
|---|---|---|---|---|
| 3,229,510 A | | 1/1966 | Bodemeijer | 73/761 |
| 5,239,468 A | * | 8/1993 | Sewersky et al. | 701/35 |
| 5,361,622 A | | 11/1994 | Wall | 73/49.2 |
| 5,893,047 A | | 4/1999 | Gimblett et al. | 702/33 |
| 6,694,285 B1 | | 2/2004 | Choe et al. | 702/182 |
| 6,944,575 B2 | | 9/2005 | Ueno et al. | 702/188 |
| 7,047,152 B2 | | 5/2006 | Horch | 702/154 |
| 2003/0083794 A1 | | 5/2003 | Halm et al. | 701/29 |
| 2005/0114090 A1 | | 5/2005 | Black et al. | 702/188 |
| 2006/0113933 A1 | * | 6/2006 | Blanding et al. | 318/116 |

FOREIGN PATENT DOCUMENTS

EP    0490805    6/1992

OTHER PUBLICATIONS

Byington, C.S., et al, "A model-based approach to prognostics and health management for flight control actuators," *2004 IEEE Aerospace Conference Proceedings*, pp. 3551-3562.
Hadden, G.D., et al., "Shipboard machinery diagnostics and prognostics/condition based maintenace: a progress report," *2000 IEEE Aerospace Conference Proceedings*, pp. 277-292.
Willgoss, R.A., "Mechatronic detection of faults in gearsets using preload and backlash measurements," *Proceedings of International symposium on automotive technology and automation* (1997), pp. 351-356.
PCT International Search Report, mailed Nov. 30, 2005.
Written Opinion of the International Searching Authority, mailed Nov. 30, 2005.

* cited by examiner

*Primary Examiner*—John Barlow
*Assistant Examiner*—Jonathan Moffat
(74) *Attorney, Agent, or Firm*—BainwoodHuang

(57) ABSTRACT

Aspects of the present invention are directed to systems, methods, and computer-readable media for measuring certain actuator system parameters of an actuator, e.g., an EMA in its working environment. Stiction and backlash are examples of such parameters, and these indicate the impending failure of an actuator system than conventional approaches of measuring the elapsed time of operation. When the measured backlash and/or stiction parameters exhibit a deleterious increase over time, e.g., by exceeding a preset threshold, imminent failure or the need for service/repair of the system is indicated.

22 Claims, 3 Drawing Sheets

ACCEPTANCE TESTING OF ACTUATORS USING BACKLASH AND STICTION MEASUREMENTS

CROSS REFERENCE TO RELATED APPLICATIONS

This application claims the benefit of U.S. Application No. 60/591,836, filed Jul. 28, 2004, entitled, "ACCEPTANCE TESTING OF FLIGHT CONTROL ACTUATORS", the contents and teachings of which are hereby incorporated by reference in their entirety. This application further relates to U.S. application Ser. No. 11/190303 filed on even date herewith, entitled "IMPROVED ACCEPTANCE TESTING OF ACTUATORS USING PREDETERMINED THRESHOLDS", the contents and teachings of which are hereby incorporated by reference in their entirety.

BACKGROUND

In general, actuators are devices that convert one form of applied power to a usable form of power that often provides motion of an output element. Various types of actuators may be used in may different types of applications and may include hydraulic, pneumatic, and electro-mechanical actuators (EMAs). An EMA is one type of actuator that includes an electric motor and one or more drive train components to transfer and/or convert power provided by the electric motor to an output element.

EMAs and other types of actuators have a finite service life, which typically ends with the complete failure of the actuator or a partial failure of the actuator that is cost-prohibitive to repair. In some applications, the failure of an actuator during operation may not be catastrophic. For other applications, however, it may be highly undesirable or catastrophic for an actuator to fail while it is being used. In aerospace applications, for example, the sudden or catastrophic failure of a flight control actuator system may have life-threatening results.

Certain conventional approaches have been developed for predicting the remaining service life or imminent failure of an actuator system. These conventional approaches typically involve measuring the elapsed time of operation for a particular actuator in its operating environment. When used in certain applications, for example in industrial applications in which the load conditions for the motor are substantially fixed and occur in substantially uniform intervals or time periods, the elapsed time of operation can be a relevant indicator of the remaining service life and service needs for the actuator system.

SUMMARY

Unfortunately, elapsed time techniques do not accurately predict actuator failure or the need for service for applications where the loading conditions are highly variable and/or intermittent in nature. Actuators that are used for flight control surfaces in an aircraft can experience a loading environment that is highly variable and the time intervals between uses may vary greatly. Various factors may include the type of the aircraft and the length and type of flight missions of the aircraft. The type of aircraft and how it is flown and for how long can contribute to the variability of the loading environment experienced by the flight control actuators on the aircraft. The most common way of dealing with the uncertainty of the service life of a flight control actuator is by routinely scheduled maintenance checks. These maintenance checks, however, can be very expensive both in terms of down time for the aircraft and in terms of the financial cost of the testing/servicing itself.

It can be seen therefore that a need exits for improved techniques for testing actuators, e.g., systems and methods that more accurately determine impending actuator system failure and/or the immediate need for servicing for actuator systems, including EMAs used in aerospace applications.

Aspects of various embodiments of the present invention are directed to systems, methods, and computer-readable media for measuring certain actuator system parameters of an actuator, e.g., an EMA in its working environment. Stiction and backlash are examples of such parameters, and these better indicate the impending failure of an actuator system than the elapsed time of operation. When these measured parameters exhibit a deleterious increase over time, e.g., by exceeding a preset threshold, imminent failure or the need for service/repair is indicated.

One embodiment of the invention is directed to a technique of acceptance testing an actuator system which involves obtaining a first rate of change of an operating characteristic of the actuator. The first rate of change is based on previous measurements of actuator movement. The technique further involves generating a second rate of change of the operating characteristic of the actuator from current measurements of actuator movement and at least some of the previous measurements of actuator movement, and electronically indicating whether the actuator is in acceptable condition based on a comparison of the second rate of change and the first rate of change.

In some embodiments, the technique further involves installing the actuator at an operating location of an aircraft. In these embodiments, obtaining, generating, and electronically indicating occur while the actuator remains installed at the operating location of the aircraft and while the aircraft is on ground. Such embodiments enable accurate acceptance testing of the actuator while the actuator remains installed at the operating location of the aircraft thus avoiding possible erroneous removal of good equipment.

BRIEF DESCRIPTION OF THE DRAWINGS

The foregoing and other objects, features and advantages of various embodiments of the invention will be apparent from the following description of these embodiments, as illustrated in the accompanying drawings in which like reference characters refer to the same parts throughout the different views. The drawings are not necessarily to scale, emphasis instead being placed upon illustrating the principles of these embodiments.

DETAILED DESCRIPTION

Figure 1:
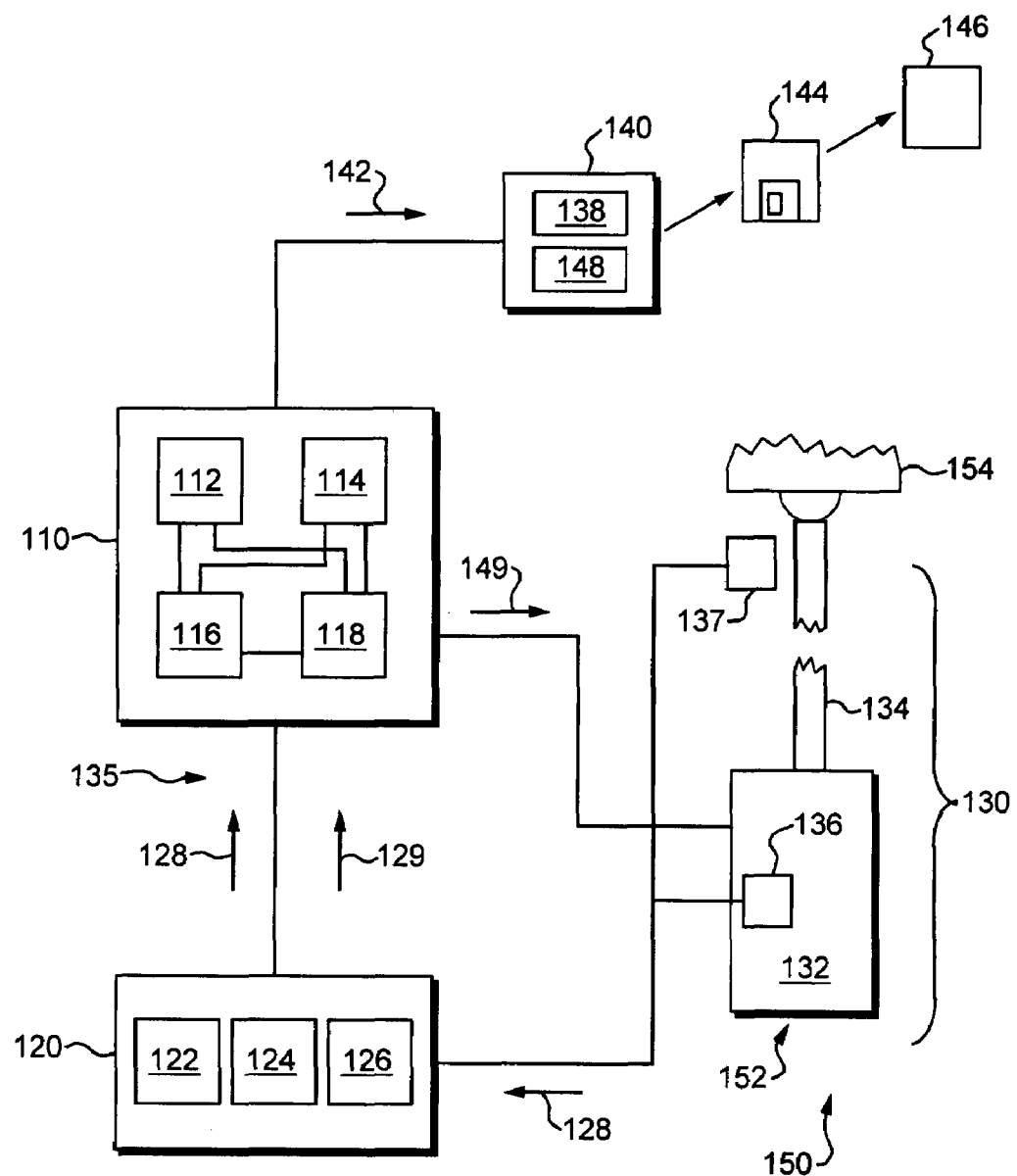
FIG. 1 is a component diagram of a representative system for predicting actuator system failure by measuring and processing backlash and/or stiction parameters, in accordance with an embodiment of the present invention.

Embodiments of the present invention may be understood by the following detailed description, which should be read in conjunction with the attached drawings. The following detailed description of certain embodiments is by way of example only and is not meant to limit the scope of the present invention.

Aspects of the present invention are directed to systems, methods, and computer-readable media (among other things) for predicting the imminent failure of an actuator system and/or the immediate need for repair or servicing. The actuator may be of any suitable type, such as an EMA, a hydraulic actuator, or a pneumatic actuator, and may be installed in an operational environment, such as onboard an aircraft. By measuring selected system parameters including stiction and/or backlash, the health or condition of the actuator system can be monitored and assessed during its operation. When either or both of these parameters change over time by exceeding a preset limit it is an indication of impending system failure and/or need for servicing.

Some embodiments are direct to computer program products which include computer-readable and computer-executable instructions, such as program modules, which are configured for execution by one or more computers, processors, or other devices capable of performing the necessary operations. Program modules may include routines, programs, objects, components, data structures, and the like that perform particular tasks or implement particular abstract data types. The functionality of the program modules may be combined or distributed as desired in various embodiments. Program modules may be included in firmware, which is software that is embedded in a hardware device that allows reading and executing the software, but does not typically allow modification, e.g., writing or deleting data by an end user. An example of firmware is a computer program in a read-only memory (ROM) integrated circuit chip. Another example of firmware is a program embedded in an erasable programmable read-only memory (EPROM) chip, which program may be modified by special external hardware, but not by an application program.

Computer-readable media suitable for implementation of computer-readable instructions may include computer storage media. Computer storage media may include volatile and non-volatile, removable and non-removable media implemented in any method or technology for storage of information such as computer readable instructions, data structures, program modules, or other data. For example, computer storage media can include, but is not limited to, RAM, ROM, EPROM (or so-called "Flash") memory, CD-ROM, digital versatile disks (DVD), magnetic cassettes, magnetic tape, magnetic disk storage, or the like. Computer-readable media may further include communications media that includes computer-readable instructions, including data structures, program modules, or other data in a modulated data signal. The term "modulated data signal" means a signal that has one or more of its characteristics set or changed in such a manner as to encode information in the signal. Communication media may include wired media such as a wired network or direct-wired connection, and wireless media such as acoustic, radio frequency (RF), optical (e.g., infrared), and other wireless media.

FIG. 1 depicts representative functional components of a system 100 for predicting EMA system failure by measuring stiction and/or backlash system parameters. The system 100 includes an electronic controller 110, means for data acquisition ("DAQ means") 120, an actuator system 130, and a communications medium 135. Signals from the actuator system 130 are received by the DAQ means 120 and then processed by the controller 110. The controller 110 is operable to control the motion of the actuator system 130 and also to calculate stiction and/or backlash present in the actuator system 130. The controller 110 may optionally send values of the stiction and backlash parameters to a database 140 for statistical analysis, as needed. Such communications take place through the communications medium 135.

The controller 110 may include the following functional components: random access memory (RAM) 112 for program execution and temporary storage; a processing core 114 that operates at a fixed computational frame rate; and input/output (I/O) means 116 for downloading and transferring stored data. The controller 110 may also include non-volatile memory 118, in certain applications, for saving running data and historical data without the need for a constant power supply. It will be understood, that although the functional components of the controller 110 are depicted in FIG. 1 as being co-located within an individual controller 110, this is not a requirement of the invention. In some embodiments, these functional components may be distributed at different locations and connected appropriately. The I/O means 116, for example, may be co-located within the DAQ means 120.

The DAQ means 120 may include a set of counters 122 (i.e., one or more counters 122), a set of integrators 124 (i.e., one or more integrators 124), and a set of peak detectors 126 (i.e., one or more peak detectors 126). The set of counters 122 is configured to count events such as for example the total elapsed time or a number of times that a Hall position detector detects a changing Hall state. The set of integrators 124 is configured to collect data as a cumulative sum of a measured system parameter multiplied by a time interval across which the measured parameter is assumed to be constant. The integrators 124 may keep a record of the total cumulative exposure to a particular measured parameter or event. The set of peak detectors 126 keep track of the greatest value or magnitude of a detected system parameter experienced by the actuator system 130 since the time of initialization of the detectors 126. Signals 128 from the sensors of the actuator system 130 are received by the DAQ means 120 which is in turn accessible by the controller 110. Signals 129 from the set of counters 122, the set of integrators 124 and the set of peak detectors 126 are also accessible by the controller 110.

The actuator system 130 is shown by way of example as an EMA which includes a motor 132, an output element 134, and various sensors as indicated by sensors 136-137. The sensors 136-137 function to report or measure data corresponding to operation of the system 100 such as position of the actuator output element 134, load on the motor 132, etc. Any suitable type and number of sensors 136-137 may be used. Examples of suitable sensors 136-137 include, but are not limited to, position transducers timers, current sensors, voltage sensors, Hall sensors, and the like. Suitable position transducers may include variable displacement transformers of the rotary (RVDT) and/or linear (LVDT) types. The signals 128 produced by the sensors 136-137 are received by the DAQ means 120 and then the input/output (I/O) means 116 of the controller 110. The controller 110 may receive the signals 128, 129 through the I/O means 116 and process system parameters 138 defined by these signals 128, 129. The controller 110 may further send signals 142 defining these system parameters 138 to a suitable database 140 for evaluation.

The database 140 may operate to keep a history of the backlash and stiction parameters. The database 140 may be stored on or transmitted across some form of computer readable media 144 that is accessible by another device 146 (e.g., a computer, microprocessor, or the like). The device 146 may operate to find trends or statistical limits for each system parameter 138, and may be implemented in any suitable hardware or software.

The controller 110 is configured and arranged to (i) control the operation of the actuator system 130 using control signals 149, and (ii) acceptance test the actuator system 130. The controller 110 may be configured to operate at a desired computational frame rate that is sufficiently fast to meet the dynamic performance requirements for the system 100. The frame rate, in certain preferred embodiments, is a fixed rate of 1 KHz. The period corresponding to the frame rate may be controlled for high regularity, for example by a timing crystal in the controller 110. A high degree of regularity may be desirable for implementation of corresponding methods and/or algorithms according to embodiments of the present invention. If the processing core 114 of the controller 110 has enough throughput, algorithms may be run at the same frame rate that the actuator system control laws are executed. Slower frame rates are acceptable for the controller 110, but preferably the frame rate is at least five (5) times the actuator bandwidth.

The non-volatile 118 of the controller 110 may include so-called "Flash" memory chips, which are electrically erasable, programmable, read-only memory (EPROM) chips that can be erased and reprogrammed in blocks instead of only one byte at a time. In certain applications, other suitable types of non-volatile memory 118 may be used. Any suitable size or capacity of the non-volatile memory 118 may be used. Various factors including data resolution, the number of position ranges that the integrators are divided into, and the number of periodic data saves that are desired may influence capacity of the non-volatile memory 118 of the system 100.

The health or functional condition of actuator systems, such as the actuator system 130 (FIG. 1), may be monitored by implementation of embodiments of the present invention by determining backlash and/or stiction parameters of the system. Such monitoring may be useful to predict imminent failure of the particular actuator system and/or immediate need for servicing or repair.

It should be understood that the above-described system 100 is particularly well-suited for use as an acceptance testing system in an aircraft working environment 150. In such a working environment 150, the actuator system 130 resides in a fixed location 152 (e.g., a mounting portion of an aircraft) and is configured to move a load 154 relative to the fixed location 152 in response to the control signals 149 from the controller 110. The system 100 is also well-suited for similar loading environments where loading is highly variable and/or where the time intervals between uses varies greatly.

The change in the mechanical backlash of the actuator system 130, which is the play or loose motion in the system 130 due to the clearance existing between mechanically contacting parts, is considered a valid indicator of a failing actuator and can lead to degraded system performance. By applying a predetermined and varying command profile to an actuator controller, the system backlash can be determined by measuring the position of the load moved by the actuator and then comparing this load movement and the command signal to a backlash model, described in more detail below.

Figure 2:
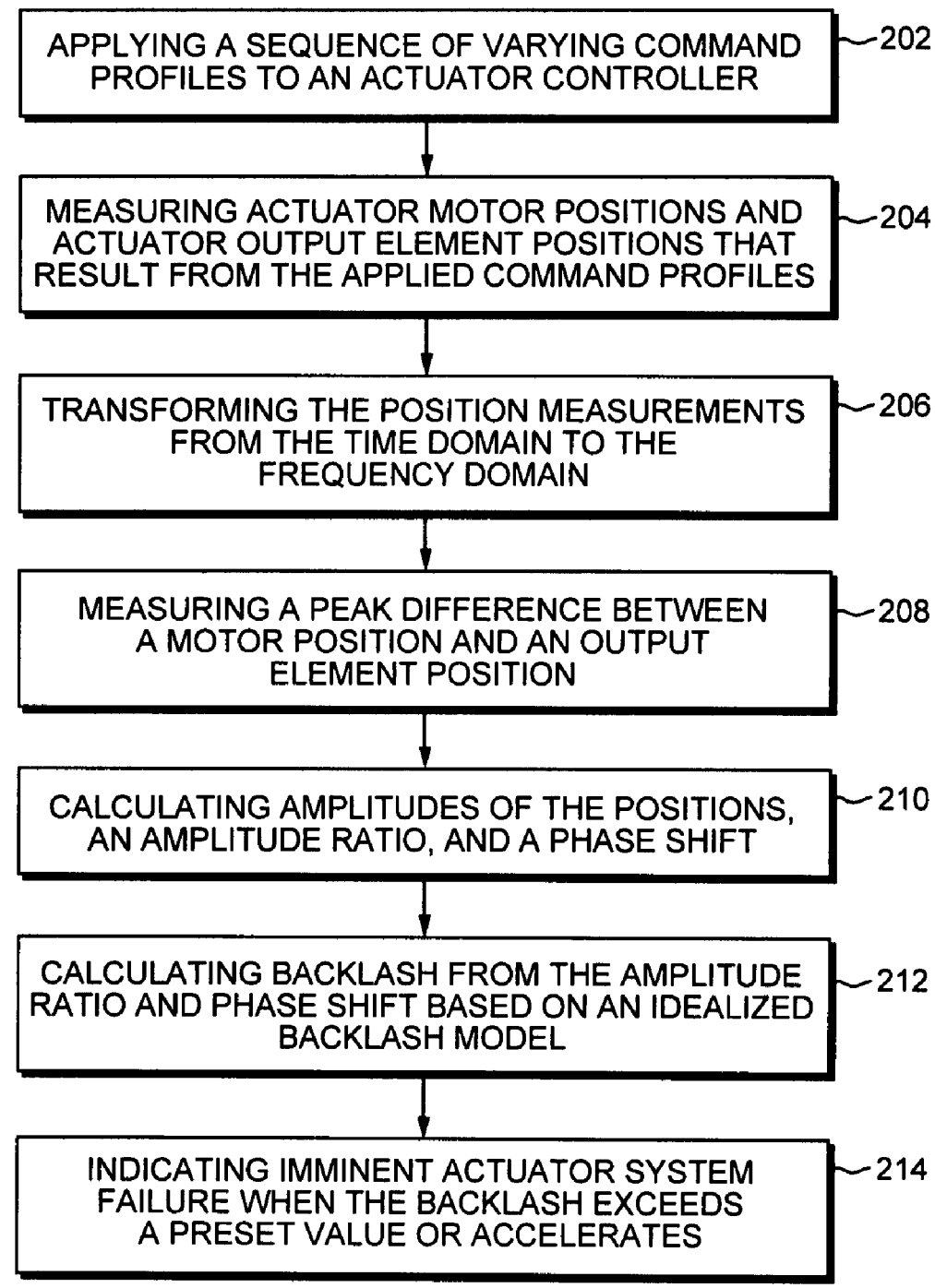
FIG. 2 shows a flowchart of a procedure for predicting actuator failure by measuring and processing backlash of the system, in accordance with a further embodiment of the present invention.

FIG. 2 shows a procedure 200 for predicting actuator system failure by measuring a system backlash parameter in the context of an EMA installed in an aircraft working environment. A sequence of varying commands profiles, e.g., sinusoidal profiles, may be applied to the actuator controller, as described at step 202 (also see the control signals 149 in FIG. 1). The command profiles are preferably applied when the actuator system 130 is installed in its operating environment, i.e., when the EMA of the actuator system 130 is installed in an aircraft on the ground and the EMA is powered up electrically. In one embodiment, the sequence of applied command profiles preferably contains integer number of complete sine wave cycles at fixed peak amplitude. In certain applications, the fixed peak amplitude of subsequent sine waves is stepped down in even increments, for example as indicated in Table 1, below. For the fastest execution, the beginning of a new cycle set may be connected in time with the end of a previous cycle set. The beginning and end of each set may be set to zero amplitude to reduce or eliminate any transients at the steps in amplitude of the command profile sequence.

An example of a suitable command profile sequence according to step 202 is depicted in Table 1 below:

TABLE 1

| Set # | Frequency (Hz) | Amplitude (% Full Stroke) | # of cycles |
|---|---|---|---|
| 1 | 15 | 0.50 | 2 |
| 2 | 15 | 0.46 | 2 |
| 3 | 15 | 0.42 | 2 |
| 4 | 15 | 0.38 | 2 |
| 5 | 15 | 0.34 | 2 |
| 6 | 15 | 0.30 | 2 |
| 7 | 15 | 0.26 | 2 |
| 8 | 15 | 0.22 | 2 |
| 9 | 15 | 0.18 | 2 |
| 10 | 15 | 0.14 | 2 |
| 11 | 15 | 0.10 | 2 |
| 12 | 15 | 0.06 | 2 |
| 13 | 15 | 0.02 | 2 |

The load that the associated actuator experiences during application of a particular command profile sequence, such as that shown in Table 1, will be the product of the load inertia, the command amplitude, and the square of $2\pi$ times the frequency. The procedure 200 is well-suited for a wide range of actual load values, and presumes that the load remains substantially consistent from run to run. The optimal frequency, amplitude range and number of cycles for a command profile sequence may be dependent on the specific details of the particular actuator under test and the load combination experienced by the actuator output element. These parameters may be changed without changing the basic procedure 200.

In synchronization with the command profiles applied for step 202, the positions of the motor 132 and actuator output element 134 are measured, as described at stop 204. Determining the peak difference between the two types of position measurements provides a measure of backlash, as described at step 206. For certain applications, a suitable time-domain-to-frequency-domain transform may be applied to the position measurement, as described at step 208.

Time-domain-to-frequency-domain transforms may be desirable in certain application for backlash measurement methods because at the typically very low amplitudes associated with backlash the measured position signals tend to be noisy. Any suitable transform may be used. In certain applications, a fast Fourier transform (FFT) or other Fourier-transform-based algorithm may be used. In certain other application, quadrature integrals using sine and cosine commands may be used.

An example of a suitable algorithm routine, or subroutine, for calculating quadrature integrals according to step 208 is described in the following subroutine:

Subroutine 1 $P_M=P_M+\text{sine(command)}*\text{position}_M$ $Q_M=Q_M+\text{cosine(command)}*\text{position}_M$ $P_O=P_O+\text{sine(command)}*\text{position}_O$ $Q_O=Q_O+\text{cosine(command)}*\text{position}_O$ $N_{SAMPLES}=N_{SAMPLES}+1$ Subroutine 1 functions to convert the time domain position measurements into the frequency domain, and approximates an FFT in a less computation-intensive implementation. For this subroutine, "command" indicates the value of the command profile applied to the actuator controller, "$N_{SAMPLES}$" is the set number, "P" indicates an in-phase amplitude, "Q" indicates a quadrature or out-of-phase amplitude, the subscript "M" refers to the actuator motor, and "O" refers to the actuator output element. The sums indicated in Table 1 are preferably calculated at the computational frame rate of the controller running the actuator. These sums are preferably reset to zero at the beginning of a step of given frequency and amplitude and saved at the end of the set. For the example sequence listed in Table 1, there would be 13 sets of the five integrated results in Subroutine 1.

From the frequency domain information, e.g., quadrature integrals, values are computed for each command profile set, as described at step 210, for the amplitudes (or gains) of the motor position and output element position, an amplitude ratio of the two, and also the relative phase shift. An example of a suitable algorithm routine, or subroutine, for calculating the gains, amplitude ratio, and phase shift for each set is described in the following subroutine:

Subroutine 2 $\text{Gain}_M=(2/N_{SAMPLES})*\text{Sqrt}(P_M^2+Q_M^2)$ $\text{Gain}_O=(2/N_{SAMPLES})*\text{Sqrt}(P_O^2+Q_O^2)$ Amplitude Ratio=$\text{Gain}_O/\text{Gain}_M$ Phase Shift=$\text{Arctan}(Q_O/P_O)-\text{Arctan}(Q_O/P_O)$ where "M" refers the actuator motor and "O" refers to the actuator output element. For the example of Table 1, Subroutine 2 would generate 13 sets of values.

The gains, amplitude ratios, and phase shifts determined according to step 210 may be used to determine the backlash of the actuator system 130, as described at step 212. In certain application, this backlash evaluation may be accomplished by using an idealized backlash model that indicates backlash as a percentage of the command profile amplitude based on the amplitude ratio and phase shift between the measured motor position and output element position, e.g., as determined according to Subroutine 2.

A suitable backlash model is indicated in the following algorithm routine, or subroutine:

Subroutine 3 For $j=1$ To 2000

Comm=$\text{Sin}(j*0.006283)$

If (Comm−$BL$)>$P_{OUT}$ Then $P_{OUT}$=Comm−$BL$

If (Comm+$BL$)<$P_{OUT}$ Then $P_{OUT}$=Comm+$BL$

Subroutine 3 include a for-loop that includes a sinusoidal command generator and two if-statements for generating a value of an output position, "Comm", based on a sinusoidal modulation of a backlash variable, "BL". The backlash variable may be incremented by a for-loop outside of and containing Subroutine 3. The value of scaling constant that is indicated in the subroutine is arbitrary and may be selected as desired.

Based on the Subroutines 1-2 and the backlash model of Subroutine 3, backlash as a percentage of the command position is indicated for corresponding amplitude ratios and phase shifts in the following table:

TABLE 2

| Backlash/Command [%] | Amplitude Ratio [---] | Phase Shift [deg] |
| --- | --- | --- |
| 0 | 1 | 0 |
| 10 | .955 | −6.9 |
| 20 | .882 | −13.4 |
| 30 | .795 | −19.7 |
| 40 | .698 | −26.1 |
| 50 | .594 | −32.6 |
| 60 | .483 | −39.4 |
| 70 | .368 | −46.7 |
| 80 | .249 | −55.1 |
| 90 | .126 | −65.6 |
| 100 | 0 | — |

Table 2 may be used as a look-up table, and indicates that as the amplitude of the command decreases toward the value of the backlash between the motor and the output, the amplitude ratio falls from an ideal value of one to a value of zero. For example, it can be seen in Table 2 that for an amplitude ratio of 0.483, corresponding to a phase shift between the motor and output positions of about 40 degrees, the backlash is approximately 60% of the motor position amplitude. For further example, at an amplitude ratio of 0.594, corresponding to a phase shift of 32.6 degrees, the backlash is about 50% of the motor position amplitude. While any backlash-to-command ratio or percentage may be used from the backlash model, determining backlash values based on backlash-to-command ratios of near 50% may be optimal. Here, the signal-to-noise ratio of the corresponding position measurements may be at optimal or the highest levels for these ratios.

The backlash that is present in the actuator system 130 will stay fairly stable or change in small amounts slowly when the actuator system 130 (e.g., the EMA of the actuator system 130) is healthy i.e., in good operating condition. As problems occur that are detrimental to actuator system performance, backlash significantly increases, and there is a strong tendency for its value to accelerate. By keeping track of the time between test runs and previous values of backlash, a rate of change can be calculated and used to flag impending failures. For example if backlash were to increase 10% over a given time where over past similar intervals it increased 1%, then this higher increase would indicate impending system failure. When backlash increases suddenly or accelerates a failure warning or need for service warning may be indicated, as described at step 214, e.g., by the actuator controller 110.

The calculations for backlash may optionally include a filtering step, in some applications, to reduce the effects of noise. For example, using the 60% of command value for backlash in Table 2, the backlash value may be calculated after the conditions are met for a specified number, of sequential steps. An example using three steps is described in the following preferred subroutine:

Subroutine 4 $BL=60\%*$(average of Gain-Motor for the first three steps where $AR<0.5$)

OR $BL=60\%*$(average of Gain-Motor for the first three steps where Phase Shift>40 deg)

where "BL" indicates the backlash parameter. The filtered backlash value will be determined by whichever condition in Subroutine 4 above occurs first.

Besides the backlash parameter described previously, another key indicator of actuator system health is the degree of stiction present for the actuator system 130. Stiction is the breakaway part of friction and is sometimes referred to as static friction. Irregularities in critical wear surface finishes of an actuator cause stiction, which typically increases with time as contaminants are introduced either from the outside environment or from damage to the actuator parts themselves. Embodiments of the present invention allow for actuator assessment with improved stiction measurement, while an actuator is installed in its operational environment, e.g., onboard an aircraft.

Figure 3:
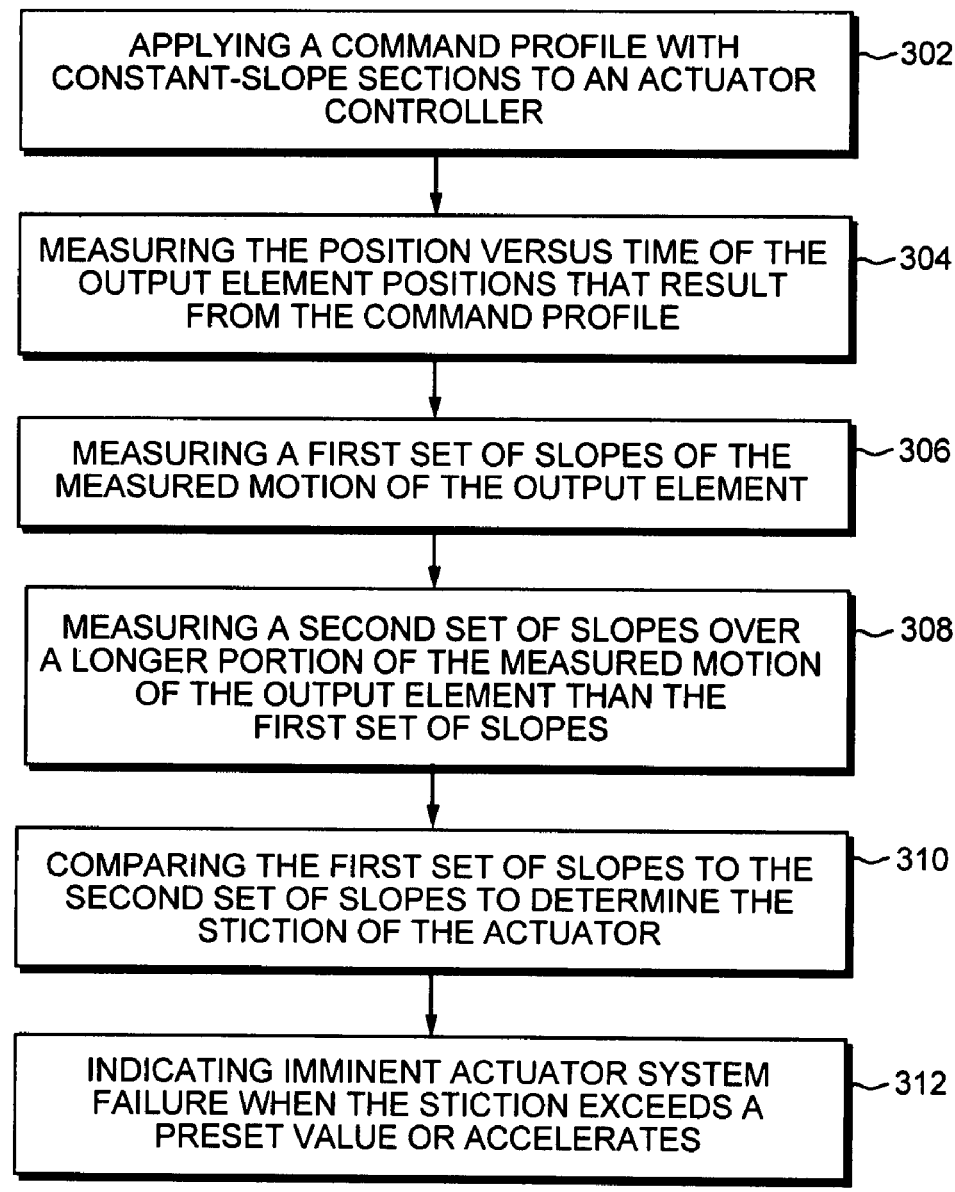
FIG. 3 shows a flowchart of a procedure for predicting actuator system failure by measuring and processing stiction of the system, in accordance with a further embodiment of the present invention.

FIG. 3 shows a procedure 300 for predicting actuator system failure by measuring a stiction parameter in the context of an aircraft working environment. In general, the procedure 300 includes applying a command signal 149 to the actuator system 130 (also see FIG. 1) with a waveform that includes one or more sections with uniform or nearly uniform slope, e.g., a continuous ramp. The response position over time, or response velocity, of the actuator output element to the command signal is measured. The peak deviation of the response velocities for small displacements from the average, or longer-slope, segments represents the greatest stiction of the system. Suitable analysis techniques for comparing the short-slope segments to the longer-slope segments of the command profile include, but are not limited to, "least-squares" analysis.

A test waveform command or command profile is applied to an actuator controller, as described at step 302. The command profile is preferably applied when the actuator system 130 is installed in its operating environment, i.e., when the EMA of the actuator system 130 is installed in an aircraft on the ground and the EMA is powered up electrically. The command profile preferably includes sections that have a constant slope. In some applications, a low-frequency triangular or saw tooth wave may be used for the command profile, for example, a typical setup might be +/−30% of the total stroke of the actuator at a frequency of 0.1 Hz. The optimal magnitude and frequency for the command profile may depend on the specifics of the actuator system 130 and its installation.

The position versus time, or response velocity, of the output element 134 that results from the command profile is measured, as described at step 304. The slopes of a number of relatively short segments of the response velocity are measured forming a first set of slopes, as described at step 306. The slopes of one or more long-range segments of the response velocity are measured, forming a second set of slopes, as described at step 308. These long-range segments preferably include the responses to the uniform-slope portions of the command profile, e.g., the ramp commands. The first set of slopes is compared to the second set of slopes, as described at step 310. The degree to which the short-range segments are greater in magnitude than the long-range segments is a measure of the stiction of the actuator system 130.

A moving or "sliding" least-squares-fit method may be used in preferred embodiments for the comparison at step 310 to reduce the effects of noise and increase repeatability. An example of suitable starting and ending points for long-range segments of a triangle-wave command profile for use in least-squares analysis is indicated in the following table:

TABLE 3

| Segment # | Start Amp [%] | End Amp [%] | Start Time [%] | End Time [%] |
|---|---|---|---|---|
| 1 | 3.3 | 27 | 2.5 | 22.5 |
| 2 | 27 | 3.3 | 27.5 | 47.5 |
| 3 | −3.3 | −27 | 52.5 | 72.5 |
| 4 | −27 | −3.3 | 77.5 | 97.5 |

The actual numerical values indicated in Table 3 are by way of example only and the actual values may vary. In some arrangements, the actuator system 130 covers as much of the stroke, or range of motion, of the actuator output element as reasonable without including the start, stop, and turnaround transients of the motion. The times listed in the table are proportional to the amplitude segments. For the triangle wave command profile indicated there would be no transient or change in slope between segment 2 and segment 3 but it may be desirable to use the break indicated for ease of implementation by a controller, i.e., the controller 110 (FIG. 1).

The least-square analysis may compute the slope of the position versus time data during the "steady state" periods of a command profile. Slopes may be calculated using "n" samples of position with the time between steps always being constant because it is set by the computational frame rate of the controller computer. The slope calculations are preferably performed on a "sliding group of data (e.g. slope #1 from samples 2, 3, and 4 and then slope #2 from samples 3, 4, and 5). Given "n" points of "x" and "y", suitable slope equations for a least-squares analysis are given as follows:

$$\text{Slope}=(\Sigma(X_j*Y_j)-u*\Sigma Y_j)/v; \text{ where} \qquad \text{EQ. 1:}$$

$$u=\Sigma X_j/n; \text{ and} \qquad \text{EQ. 2:}$$

$$v=\Sigma X_j^2-((\Sigma X_j)^2)/n; \text{ and} \qquad \text{EQ. 3:}$$

where j=a specific sample number in the sequence of data.

Because of the high regularity that controllers may achieve, certain assumptions may be made for the variables in Equations 1-3 that reduce the computational load on the actuator controller and its throughput requirements. For example, given that the x-values in Equations 1-3 would typically represent time values that are controlled by the controller to be exactly and repetitively spaced, the distance between the x-values may often by normalized to unity. When such assumptions are made, $\Sigma X_j$, $\Sigma X_j^2$, u, and v, may be simplified, as represented by the following equations:

$$\Sigma X_j=n*(n-1)/2 \qquad \text{EQ. 4:}$$

$$\Sigma X_j^2=n*(n-1)*(2n-1)/6 \qquad \text{EQ. 5:}$$

$$u=(n-1)/2 \qquad \text{EQ. 6:}$$

$$v=n*(n-1)*[((2n-1)/6-((n-1)/4)] \qquad \text{EQ. 7:}$$

Using the simplified least-squares formula in Equations 4-7, the corresponding values of $\Sigma X_j$, $\Sigma X_j^2$, u, and v for specified values of n are indicated in tabular form in Table 4:

TABLE 4

| n | $\Sigma X_j$ | $\Sigma X_j^2$ | u | v |
|---|---|---|---|---|
| 2 | 1 | 1 | 0.5 | 0.5 |
| 3 | 3 | 5 | 1 | 2 |
| 4 | 6 | 14 | 1.5 | 5 |
| 5 | 10 | 30 | 2 | 10 |
| 6 | 15 | 55 | 2.5 | 17.5 |
| 7 | 21 | 91 | 3 | 28 |
| 8 | 28 | 140 | 3.5 | 42 |
| 9 | 36 | 204 | 4 | 60 |
| 10 | 45 | 285 | 4.5 | 82.5 |
| 11 | 55 | 385 | 5 | 110 |
| 12 | 66 | 506 | 5.5 | 143 |
| 13 | 78 | 650 | 6 | 182 |
| 14 | 91 | 819 | 6.5 | 227.5 |
| 15 | 105 | 1015 | 7 | 280 |
| 16 | 120 | 1240 | 7.5 | 340 |
| 17 | 136 | 1496 | 8 | 408 |
| 18 | 153 | 1785 | 8.5 | 484.5 |
| 19 | 171 | 2109 | 9 | 570 |
| 20 | 190 | 2470 | 9.5 | 665 |

The assumptions and pre-calculated intermediate variables of Table 4 may be used by a controller to greatly save on computational time and resources when implementing method 300.

Certain algorithms or program subroutine will now be described for a preferred embodiment of method 300. On the start of a command profile sequence applied to an actuator output element by its associated controller, where the small slope sample size is N samples and the full range size is T samples, a circular buffer for the past "$Y_j$" values may be cleared that is at least N samples deep. A sample counter (I), a short-range sum of the products variable ($S_{XY}$), a short-range sum of Y variable ($S_Y$), a total-range sum of products variable ($ST_{XY}$), and a total-range sum of Y variable ($ST_Y$) are initialized to zero. A min-slope "track-and-hold" value is initialized to a large number (e.g., Slope$_{MIN}$=10000). A max-slope track-and-hold value is initialized to a small number (e.g., Slope$_{MAX}$=−10000).

For each data point of the measured response velocities to be analyzed, the following calculations of may be made:

Subroutine 5 $S_Y = S_Y + Y(I) - Y(I - N_{SAMPLES})$ $S_{XY} = S_{XY} + (N_{SAMPLES} - 1) * Y(I) - \Sigma Y[(I-1) \text{ thru } (I - (N_{SAMPLE} - 1))]$ $ST_Y = ST_Y + Y(I)$ $ST_{XY} = ST_{XY} + I * Y(I)$ The Y(I) values are saved in the circular buffer $I = I + 1$ For all steps where $I \geq N_{SAMPLES}$, the calculations are made according to the following subroutine:

Subroutine 6 Slope = $(S_{XY} - u * S_Y) / v$

If (Slope > Slope$_{MAX}$) Then Slope$_{MAX}$=Slope

If (Slope < Slope$_{MIN}$) Then Slope$_{MIN}$=Slope

At the end of a sequence (i.e., I=T$_{SAMPLES}$), u and v values are calculated by inserting T$_{SAMPLES}$ into Equations 6-7. The total slope may be calculated by way of the following equation:

$$\text{TotalSlope} = (ST_{XY} - u * ST_Y) / v \qquad \text{EQ. 8:}$$

When results have been obtained for the response velocities corresponding to the desired constant-slope sections of the command profile, e.g., the four sequences of the triangle waveform of Table 3, the percent-greater-than and the percent-less-than the nominal slope for each are calculated:

$$\text{Percent Greater} = 100 * (\text{Slope}_{MAX} - \text{Slope}_{TOTAL}) / \text{Slope}_{TOTAL} \qquad \text{EQ. 9:}$$

$$\text{Percent Less} = 100 * (\text{Slope}_{TOTAL} - \text{Slope}_{MIN}) / \text{Slope}_{TOTAL} \qquad \text{EQ. 10:}$$

The actuator position smoothness is the greatest value determined by Eqs. 9-10 for all of the response velocities that correspond to the constant-slope sections of the command profile. The value of smoothness that is calculated by Eqs. 9-10 is a measure of the stiction of the actuator system.

The stiction parameter of the actuator system 130 tends to stay fairly stable or change in small amounts slowly over the bulk of the life of the system 130. As problems occur that would cause a significant increase in stiction, there is a strong tendency for its values to accelerate in a direction that is detrimental to system performance. By keeping track of the time between test runs and previous values of stiction, the rates of change can be calculated and used to flag impending failures. For certain applications, the rates of change may be calculated in a suitable database, e.g., database 140 of FIG. 1. For example if stiction were to increase 10% over a given time where over past similar intervals it increased 1%, then this higher increase would indicate impending system failure. When stiction increases suddenly or accelerates this indicates a failure or need for service, as described at step 312, which may be announced by a warning issued by the actuator controller 110.

It will be understood that embodiments of the present invention offer various advantages over conventional approaches. Systems, methods, and computer-readable media according to particular embodiments of the present invention measure backlash and/or stiction of an actuator system. These parameters are more indicative of actuator system health than just the elapsed time of operation for a particular actuator in its working environment. Imminent failure and need for service can accordingly be predicted for actuators in applications and working environments that would hinder conventional approaches.

While certain embodiments have been described other are possible within the scope of the present invention. Methods and algorithms according to various embodiments of the present invention may be implemented as computer-executable instructions in any suitable computer-readable medium and in any type of suitable hardware. Moreover, the subroutines described are not limited to any specific programming language and may be implemented with language-specific context in any suitable programming language. Furthermore, while the previous description of particular embodiments gave examples of EMA systems, the scope of the present invention includes applications to other types of actuators.

Furthermore, it should be understood that the above-described techniques are capable of being combined with other acceptance testing techniques such as techniques which involve comparisons of system parameters (e.g., see the system parameters 138 in FIG. 1) with predefined thresholds (e.g., see the thresholds 148 in FIG. 1). Examples of such system parameter comparison techniques are disclosed in earlier-referenced U.S. application Ser. No. 11/190,303 filed on even date herewith, entitled "IMPROVED ACCEPTANCE TESTING OF ACTUATORS USING PREDETERMINED THRESHOLDS", the contents and teachings of which are hereby incorporated by reference in their entirety.

What is claimed is:

1. A test system to acceptance test an actuator, the test system comprising:
    a sensing circuit;
    a controller; and
    a communications medium connecting the sensing circuit and the controller, the controller being configured to:
        obtain a first rate of change of an operating characteristic of the actuator, the first rate of change being based on previous measurements of actuator movement,
        generate a second rate of change of the operating characteristic of the actuator from current measurements of actuator movement and at least some of the previous measurements of actuator movement, and
        electronically indicate whether the actuator is in acceptable condition based on a comparison of the second rate of change and the first rate of change;
    wherein the actuator is configured to install at an operating location of an aircraft;
    wherein the controller is configured to obtain the first rate of change, generate the second rate of change, and electronically indicate whether the actuator is in acceptable condition while the actuator remains installed at the operating location of the aircraft and while the aircraft is on ground;
    wherein the operating characteristic of the actuator is backlash of the actuator;
    wherein the first rate of change is based on actuator movement over a first operating interval;
    and wherein the controller, when electronically indicating whether the actuator is in acceptable condition includes, is configured to:
        provide a result signal indicating whether the backlash of the actuator has substantially increased over a second operating interval, the second operating interval being substantially equal to the first operating interval.

2. A test system as in claim 1 wherein the actuator includes a motor and an output element coupled to the motor; and wherein the controller, when generating the second rate of change, is configured to:
    provide a set of motor signals to the motor of the actuator to move the output element,
    measure motor positions of the motor and corresponding output element positions of the output element in response to the provided set of motor signals, and
    output a current backlash measurement based on the measured motor positions and the measured corresponding output element positions.

3. A test system as in claim 2 wherein the controller, when outputting the current backlash measurement, is configured to:
    determine a series of differences between the measured motor positions and the measured corresponding output elements positions; and
    select a peak difference from the series of differences, the selected peak difference being the current backlash measurement.

4. A test system as in claim 3 wherein the controller, when providing the result signal, is configured to:
    provide the result signal with (i) a first value when the second rate of change is less than 10% to indicate that the actuator is in acceptable condition, and (ii) a second value when the second rate of change is greater than or equal to 10% to indicate that the actuator is no longer in acceptable condition, the first value being different that the second value.

5. A test system as in claim 2, wherein the controller, when providing the set of motor signals to the motor of the actuator, is configured to:
    apply a sequence of varying command profiles to the motor, the sequence including at plurality of complete sine wave cycles of a fixed amplitude, the fixed amplitude of subsequent sine waves being stepped down in even increments.

6. A test system as in claim 2, wherein the controller, when measuring the motor positions and output element positions and outputting the current backlash measurement, is configured to:
    obtain frequency domain information by applying a time-domain-to-frequency-domain transform to the measured motor positions and the measured output element positions;
    from the frequency domain information, compute an amplitude ratio and a phase shift between respective amplitude measurements of the measured motor positions and the measured output element positions; and
    utilize an ideal backlash model to identify the backlash as a percentage of a commanded position based on the amplitude ratio and phase shift.

7. A test system to acceptance test an actuator, the test system comprising:
    a sensing circuit;
    a controller; and
    a communications medium connecting the sensing circuit and the controller, the controller being configured to:
        obtain a first rate of change of an operating characteristic of the actuator, the first rate of change being based on previous measurements of actuator movement,
        generate a second rate of change of the operating characteristic of the actuator from current measurements of actuator movement and at least some of the previous measurements of actuator movement, and
        electronically indicate whether the actuator is in acceptable condition based on a comparison of the second rate of change and the first rate of change;
    wherein the actuator is configured to install at an operating location of an aircraft;
    wherein the controller is configured to obtain the first rate of change, generate the second rate of change, and electronically indicate whether the actuator is in acceptable condition while the actuator remains installed at the operating location of the aircraft and while the aircraft is on ground;
    wherein the operating characteristic of the actuator is stiction of the actuator;
    wherein the first rate of change is based on actuator movement over a first operating interval;
    and wherein the controller, when electronically indicating whether the actuator is in acceptable condition, is configured to:

provide a result signal indicating whether the stiction of the actuator has substantially increased over a second operating interval, the second operating interval being substantially equal to the first operating interval.

8. A test system as in claim 7 wherein the actuator includes a motor and an output element coupled to the motor; and wherein the controller, when generating the second rate of change, is configured to:
provide a set of motor signals to the motor of the actuator to move the output element over multiple small displacements and over a large displacement,
measure response velocities of the output element in response to movements of the output element over the multiple small displacements and over the large displacement, and
output a current stiction measurement based on the measured response velocities of the output element.

9. A test system as in claim 8 wherein the controller, when outputting the current stiction measurement, is configured to:
determine a series of velocity deviations, each velocity deviation being a difference between a particular response velocity measured during movement of the output element over a particular one of the multiple small displacements and a response velocity measured during movement of the output element over the large displacement; and
select a peak velocity deviation from the series of velocity deviations, the peak velocity, deviation being the current stiction measurement.

10. A test system as in claim 9 wherein the controller, when providing the result signal, is configured to:
provide the result signal with (i) a first value when the second rate of change is less than 10% to indicate that the actuator is in acceptable condition, and (ii) a second value when the second rate of change is greater than or equal to 10% to indicate that the actuator is no longer in acceptable condition, the first value being different that the second value.

11. A test system as in claim 7, wherein:
the controller, when providing the set of motor signals to the motor of the actuator, is configured to apply the motor signals with a waveform that includes one or more sections with uniform or nearly uniform slope; and
the controller, when measuring the motor positions and output element positions and providing the result signal, is configured to (1) measure short and long segments of response velocity of the output element to form respective first and second sets of slopes, and (2) compare the first and second sets of slopes.

12. A method of acceptance testing an actuator, the method comprising:
obtaining a first rate of change of an operating characteristic of the actuator, the first rate of chance being based on previous measurements of actuator movement;
generating a second rate of change of the operating characteristic of the actuator from current measurements of actuator movement and at least some of the previous measurements of actuator movement; and
electronically indicating whether the actuator is in acceptable condition based on a comparison of the second rate of change and the first rate of change; and
installing the actuator at an operating location of an aircraft;

and wherein obtaining, generating, and electronically indicating occur while the actuator remains installed at the operating location of the aircraft and while the aircraft is on the ground;
wherein the operating characteristic of the actuator is backlash of the actuator;
wherein the first rate of change is based on actuator movement over a first operating interval;
and wherein electronically indicating whether the actuator is in acceptable condition includes;
providing a result signal indicating whether the backlash of the actuator has substantially increased over a second operating interval, the second operating interval being substantially equal to the first operating interval.

13. A method as in claim 12 wherein the actuator includes a motor and an output element coupled to the motor; and wherein generating the second rate of change includes:
providing a set of motor signals to the motor of the actuator to move the output element,
measuring motor positions of the motor and corresponding output element positions of the output element in response to the provided set of motor signals, and
outputting a current backlash measurement based on the measured motor positions and the measured corresponding output element positions.

14. A method as in claim 13 wherein outputting the current backlash measurement includes:
determining a series of differences between the measured motor positions and the measured corresponding output elements positions; and
selecting a peak difference from the series of differences, the selected peak difference being the current backlash measurement.

15. A method as in claim 14 wherein providing the result signal includes:
providing the result signal with (i) a first value when the second rate of change is less than 10% to indicate that the actuator is in acceptable condition, and (ii) a second value when the second rate of change is greater than or equal to 10% to indicate that the actuator is no longer in acceptable condition, the first value being different that the second value.

16. A method as in claim 13, wherein providing the set of motor signals to the motor of the actuator includes:
applying a sequence of varying command profiles to the motor, the sequence including at plurality of complete sine wave cycles of a fixed amplitude, the fixed amplitude of subsequent sine waves being stepped down in even increments.

17. A method as in claim 13, wherein measuring the motor positions and output element positions and outputting the current backlash measurement includes:
obtaining frequency domain information by applying a time-domain-to-frequency-domain transform to the measured motor positions and the measured output element positions;
from the frequency domain information, computing an amplitude ratio and a phase shift between respective amplitude measurements of the measured motor positions and the measured output element positions; and
utilizing an ideal backlash model to identify the backlash as a percentage of a commanded position based on the amplitude ratio and phase shift.

18. A method of acceptance testing an actuator, the method comprising:

obtaining a first rate of change of an operating characteristic of the actuator, the first rate of change being based on previous measurements of actuator movement;

generating a second rate of change of the operating characteristic of the actuator from current measurements of actuator movement and at least some of the previous measurements of actuator movement; and electronically indicating whether the actuator is in acceptable condition based on a comparison of the second rate of change and the first rate of change; and installing the actuator at an operating location of an aircraft;

and wherein obtaining, generating, and electronically indicating occur while the actuator remains installed at the operating location of the aircraft and while the aircraft is on the ground;

wherein the operating characteristic of the actuator is stiction of the actuator;

wherein the first rate of change is based on actuator movement over a first operating interval;

and wherein electronically indicating whether the actuator is in acceptable condition includes;

providing a result signal indicating whether the stiction of the actuator has substantially increased over a second operating interval, the second operating interval being substantially equal to the first operating interval.

19. A method as in claim 18 wherein the actuator includes a motor and an output element coupled to the motor; and wherein generating the second rate of change includes:

providing a set of motor signals to the motor of the actuator to move the output element over multiple small displacements and over a large displacement, measuring response velocities of the output element in response to movements of the output element over the multiple small displacements and over the large displacement, and outputting a current stiction measurement based on the measured response velocities of the output element.

20. A method as in claim 19 wherein outputting the current stiction measurement includes:

determining a series of velocity deviations, each velocity deviation being a difference between a particular response velocity measured during movement of the output element over a particular one of the multiple small displacements and a response velocity measured during movement of the output element over the large displacement; and selecting a peak velocity deviation from the series of velocity deviations, the peak velocity deviation being the current stiction measurement.

21. A method as in claim 20 wherein providing the result signal includes:

providing the result signal with (i) a first value when the second rate of change is less than 10% to indicate that the actuator is in acceptable condition, and (ii) a second value when the second rate of change is greater than or equal to 10% to indicate that the actuator is no longer in acceptable condition, the first value being different that the second value.

22. A method as in claim 18, wherein:

providing the set of motor signals to the motor of the actuator includes applying the motor signals with a waveform that includes one or more sections with uniform or nearly uniform slope; and measuring the motor positions and output element positions and providing the result signal includes (1) measuring short and long segments of response velocity of the output element to form respective first and second sets of slopes, and (2) comparing the first and second sets of slopes.

* * * * *